United States Patent
Nakamoto et al.

(10) Patent No.: US 6,992,016 B2
(45) Date of Patent: Jan. 31, 2006

(54) CHEMICAL PROCESSING METHOD, AND METHOD OF MANUFACTURING SEMICONDUCTOR DEVICE

(75) Inventors: Takeo Nakamoto, Hyogo (JP); Katsuya Kosaki, Tokyo (JP); Masaru Kinugawa, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 11/000,978

(22) Filed: Dec. 2, 2004

(65) Prior Publication Data

US 2005/0092431 A1    May 5, 2005

Related U.S. Application Data

(62) Division of application No. 10/615,769, filed on Jul. 10, 2003, now Pat. No. 6,849,865.

(30) Foreign Application Priority Data

Nov. 21, 2002  (JP) .............................. 2002-337539

(51) Int. Cl.
    *H01L 21/302*    (2006.01)

(52) U.S. Cl. .................. 438/745; 438/906; 438/974
(58) Field of Classification Search ............... 438/745, 438/906, 974
    See application file for complete search history.

(56) References Cited

U.S. PATENT DOCUMENTS

| | | | |
|---|---|---|---|
| 4,468,127 A | 8/1984 | Agosta | |
| 5,143,018 A | 9/1992 | Meakin | |
| 5,292,373 A | 3/1994 | Arita et al. | |
| 5,948,173 A * | 9/1999 | Huh et al. | ............ 134/34 |
| 6,139,755 A | 10/2000 | Marte et al. | |

FOREIGN PATENT DOCUMENTS

| JP | 5-21413 | 1/1993 |
|---|---|---|
| JP | 5-299406 | 11/1993 |

* cited by examiner

*Primary Examiner*—David Nelms
*Assistant Examiner*—Quoc Hoang
(74) *Attorney, Agent, or Firm*—Leydig, Voit & Mayer, Ltd.

(57) ABSTRACT

Air trapped in a blind hole during processing of the blind hole with a liquid is eliminated by circulating the liquid along a surface-to-be-processed in substantially a single direction at all times and by setting a velocity gradient of the liquid over the surface to at least 300/second.

8 Claims, 4 Drawing Sheets

CHEMICAL PROCESSING METHOD, AND METHOD OF MANUFACTURING SEMICONDUCTOR DEVICE

This application is a division of Ser. No. 10/615,769, filed Jul. 10, 2003, now U.S. Pat. No. 6,849,865.

BACKGROUND OF THE INVENTION

1. Field of the Invention

The present invention relates to a chemical processor and a chemical processing method for subjecting a member to be processed, such as a semiconductor wafer, to chemical processing, as well as to a method of manufacturing a semiconductor device using the processor and method.

2. Background Art

A semiconductor device is generally produced from a semiconductor wafer made of group IV compounds such as silicon or III–V group compounds such as gallium arsenide. Via holes penetrating through a semiconductor substrate from the front to back thereof are formed in a finished semiconductor device for establishing electrical contact with ground electrodes provided on the back of a semiconductor substrate formed by slicing a semiconductor wafer. In many cases, the via holes are subjected to chemical processing, such as that pertaining to a cleaning process and that pertaining to a plating process. A semiconductor wafer which has not yet been separated into a plurality of semiconductor devices is subjected to processing pertaining to the cleaning process and that pertaining to the plating process. Via holes are formed in areas of the semiconductor wafer which are to become semiconductor substrates of a plurality of semiconductor devices. The semiconductor wafer is subjected to processing pertaining to the cleaning process and that pertaining to the plating process while an opening provided at one end of each via hole is closed; that is, while the via holes are held in the form of blind holes.

During the cleaning process, contaminants, and etch residues or resist residues which remain in blind holes are removed. For instance, during a process for manufacturing a semiconductor device having such blind holes, blind holes are formed through, e.g., reactive ion etching. Organic polymer residues and resist residues, which include carbon and chloride produced during reactive ion etching, still remain in the blind holes formed through reactive ion etching. Hence, before proceeding to the plating process, the wafer is subjected to processing pertaining to the cleaning process for removing the residues.

In many cases, interior surfaces of the blind holes are plated with gold (Au). Processing pertaining to the plating process is performed subsequent to that pertaining to the cleaning process. A plating layer is formed on the interior surfaces of the respective via holes formed in the form of blind holes. Processing pertaining to the plating process includes electroless plating and electrolytic plating.

Processing pertaining to the cleaning process and that pertaining to the plating process involve a necessity of bringing a chemical, such as a cleaning fluid or a plating fluid, into contact with interior surfaces of the blind holes. However, the semiconductor wafer that has not yet been immersed in a chemical remains dry, and interior surfaces of the respective blind holes also remain dry. When such a dry semiconductor wafer is immersed in a chemical, air traps including air bubbles are often formed inside the blind holes. Such an air trap corresponds to air bubbles building up at one location on the interior surface of the blind hole, thereby hindering the chemical from coming into contact with the entire internal surface of the blind hole. When the air traps have developed, failure to clean or plate the insides of the blind holes arises, which in turn results in lower reliability of a finished semiconductor device or a decrease in yield.

FIG. 1 of JP-A-5-299406 shows a proposed substrate cleaning bath which cleans a substrate by causing a cleaning fluid supplied from a cleaning fluid supply port of the substrate cleaning bath to flow parallel to the substrate through use of a straightening vane. JP-A-5-21413 also describes a proposed cleaning apparatus and method for cleaning a semiconductor substrate by causing a chemical to flow in parallel through use of a slit wall surface. However, these publications fail to describe a chemical processor and a chemical processing method for use with blind holes.

SUMMARY OF THE INVENTION

The purpose of the invention is to provide an improved chemical processor capable of preventing occurrence of processing failures on a surface which is to be processed and has blind holes, which would otherwise be caused by air traps.

The purpose of the invention is to provide an improved chemical processing method which prevents occurrence of processing failures on blind holes, which would otherwise be caused by air traps.

The purpose of the invention is to provide a semiconductor device manufacturing method including an improved chemical processing process capable of preventing occurrence of processing failures, which would otherwise be caused by air traps.

According to one aspect of the present invention, a chemical processor comprises a chemical processing cup, in which a member-to-be-processed is to be provided, and a pumping device for circulating a liquid chemical within the chemical processing cup, the member-to-be-processed includes a surface-to-be-processed which is placed face up. The surface-to-be-processed is chemically processed while the liquid chemical is circulated along the surface-to-be-processed in substantially a given direction at all times and at a velocity gradient of 300/second or more.

According to another aspect of the present invention, in a chemical processing method, a member-to-be-processed having a plurality of blind holes formed in a surface-to-be-processed is placed in a chemical processing cup such that the surface-to-be-processed is oriented upward. The surface-to-be-processed is chemically processed while a liquid chemical is circulated along the surface-to-be-processed in substantially a given direction at all times and at a velocity gradient of 300/second or more.

According to other aspect of the present invention, in a method for manufacturing a semiconductor device a semiconductor wafer having a plurality of blind holes formed in a surface-to-be-processed is placed in a chemical processing cup such that the surface-to-be-processed is oriented upward. The surface-to-be-processed is chemically processed while a liquid chemical is circulated along the surface-to-be-processed in substantially a given direction at all times and at a velocity gradient of 300/second or more.

Other and further objects, features and advantages of the invention will appear more fully from the following description.

DETAILED DESCRIPTION OF THE PREFERRED EMBODIMENTS

First Embodiment

Figure 1:
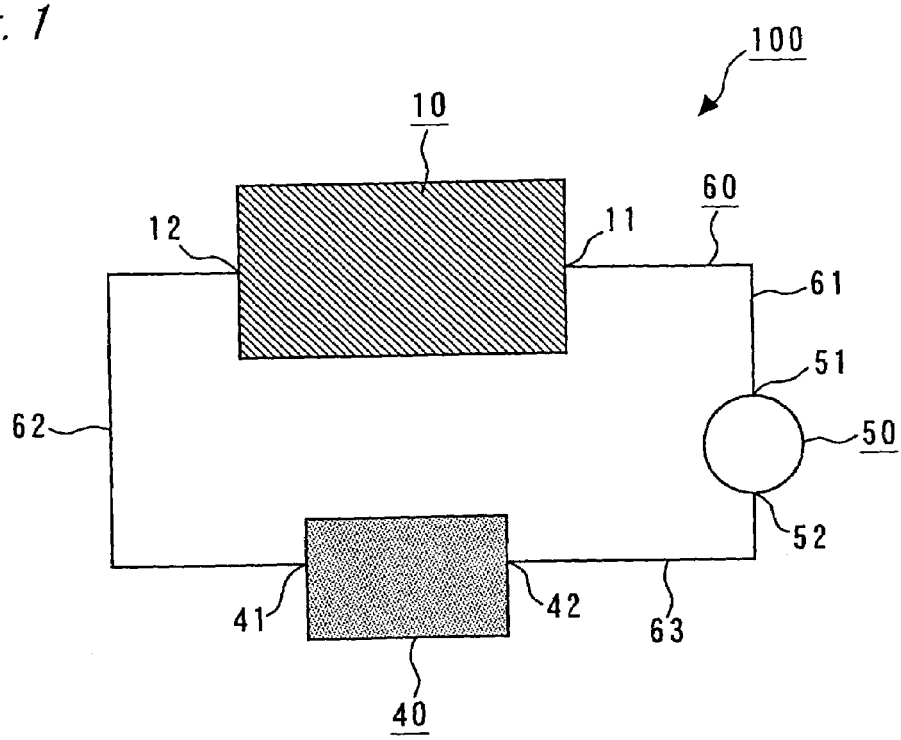
FIG. 1 is a block diagram showing a chemical processor according to a first embodiment.

FIG. 1 is an overall block diagram showing a first embodiment of a chemical processor according to the present invention. The chemical processor shown in FIG. 1 will be described along with a chemical processing method using the chemical processor of the first embodiment and a method of manufacturing a semiconductor device using the method.

A chemical processor 100 shown in FIG. 1 has a chemical processing cup 10; a chemical tank 40 which stores a chemical; a pumping device 50 for supplying a chemical (specifically, a liquid chemical) to the chemical processing cup 10; and a chemical circulation system 60.

The chemical processing cup 10 has a chemical supply port 11 and a chemical drain port 12. The chemical tank 40 has chemical circulation ports 41, 42. The pumping device 50 has a chemical outlet 51 and a chemical inlet 52. The outlet port 51 of the pumping device 50 is connected to the chemical supply port 11 of the chemical processing cup 10 via a pipe 61, and the chemical drain port 12 of the chemical processing cup 10 is connected to the chemical circulation port 41 of the chemical tank 40 by means of a pipe 62. The circulation port 42 of the chemical tank 40 is connected to the inlet 52 of the pumping device 50 by means of a pipe 63. The chemical circulation system 60 comprises the chemical processing cup 10, the chemical tank 40, the pumping device 50, and the pipes 61, 62, 63.

Figure 2:
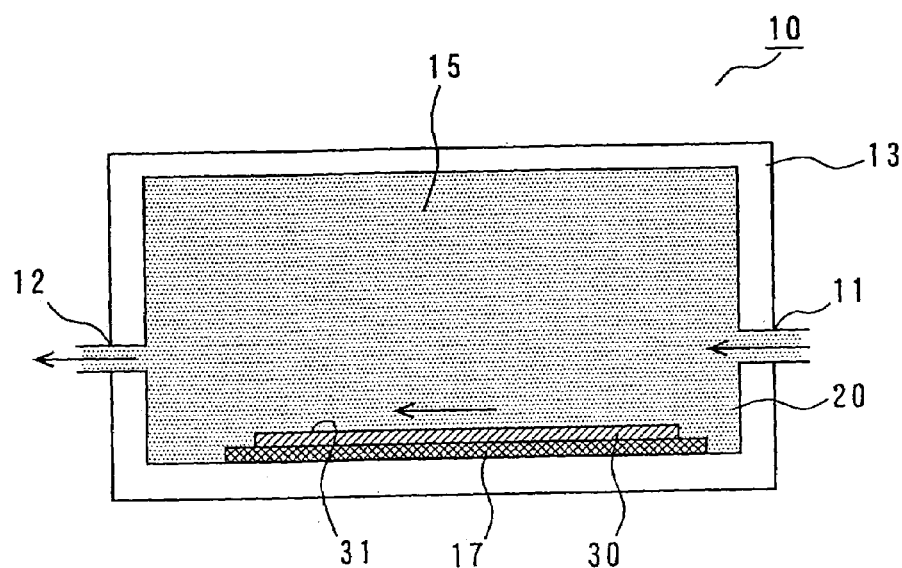
FIG. 2 is a cross-sectional view of a chemical processing cup according to a first embodiment.

FIG. 2 is a cross-sectional view showing the internal configuration of the chemical processing cup 10. The chemical processing cup 10 is constituted in the form of a closed chemical processing cup for processing a member-to-be-processed 30, that is, a semiconductor wafer, with a chemical. The chemical processing cup 10 has a closed processing chamber 15 enclosed by, e.g., a rectangular-parallelepiped container 13. The chemical supply port 11 and the chemical drain port 12, both communicating with the processing chamber 15, are formed in the side surfaces of the container 13 so as to oppose each other.

The processing chamber 15 is constructed such that a chemical 20 supplied from the pumping device 50 to the chemical supply port 11 is circulated toward the chemical drain port 12 under a predetermined pressure and at a predetermined flow rate. A wafer holding table 17 is provided on a bottom wall surface of the container 13, and a semiconductor wafer 30 is mounted, as a member to be processed, on the wafer holding table 17. The member-to-be-processed 30; that is, a semiconductor wafer, is mounted face-up such that a surface-to-be-processed 31 faces a vertical direction. The chemical 20 is circulated in a substantially horizontal direction within the processing chamber 15 from the chemical supply port 11 to the chemical drain port 12. The chemical 20 is circulated at a predetermined velocity gradient along and over the surface-to-be-processed 31.

Circulation of the chemical 20 in the processing chamber 15 of the chemical processing cup 10 is performed by the pumping device 50. For instance, a magnetic pump is used for the pumping device 50. The magnetic pump 50 supplies the chemical 20 to the chemical supply port 11 at substantially a given pressure at all times. In the processing chamber 15, the chemical 20 is circulated toward the chemical outlet port 12 in substantially a given direction along the surface-to-be-processed 31 at all times.

Figure 3:
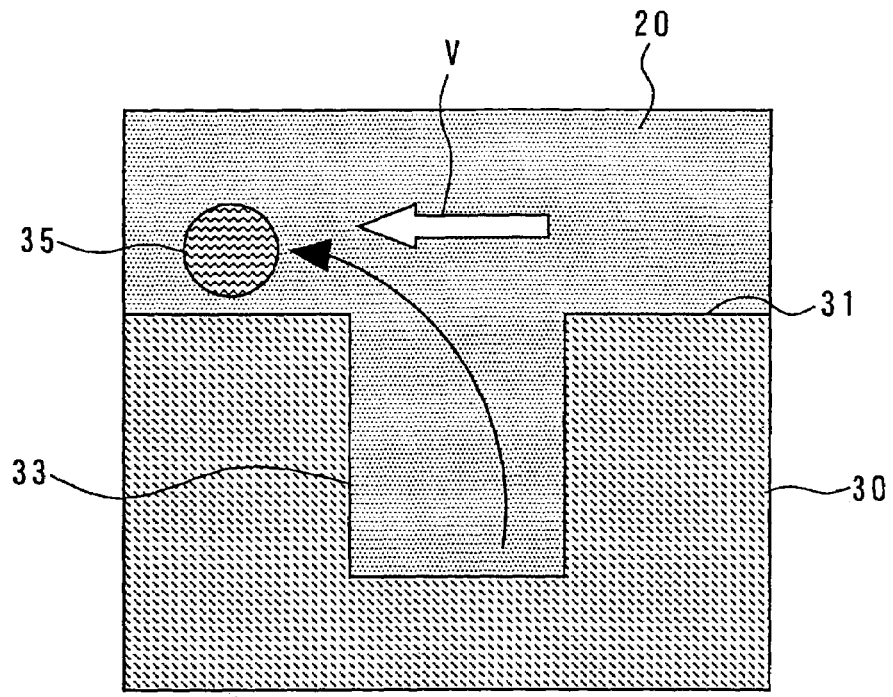
FIG. 3 is a schematic cross-sectional view showing a portion of a member-to-be-processed and the flow of a chemical according to the present invention.

FIG. 3 shows circulation of the chemical 20 over the member-to-be-processed 30; that is, the surface-to-be-processed 31 of the semiconductor wafer, in an enlarged manner. A portion of the member-to-be-processed 30 is illustrated in an enlarged manner, and a blind hole 33 is opened in the surface-to-be-processed 31. The blind hole 33 is made by closing a lower opening end of a via hole. The semiconductor wafer 30 is one which has not yet been sliced into pieces of semiconductor devices. At least one blind hole 33 is formed in each of the semiconductor devices. The blind hole 33 is formed in a semiconductor device separated from the semiconductor wafer 30 so as to impart a predetermined potential to the back of a semiconductor substrate of the device. FIG. 3 shows only a portion of the semiconductor wafer 30 including only one blind hole 33. In reality, the blind holes 33 are formed so as to correspond to respective semiconductor devices. Upper ends of the plurality of blind holes 33 are opened in the surface-to-be-processed 31.

The chemical 20 is circulated along the surface-to-be-processed 31 at a predetermined flow rate V and in substantially one direction at all times in the form of a laminar flow, such as that designated by the arrow shown in FIG. 3, while remaining in contact with the surface-to-be-processed 31. Flow of the chemical 20 is substantially in parallel with the surface-to-be-processed 31. An air bubble 35 entrapped in the blind hole 33 is withdrawn by the flow of the chemical 20 over the surface-to-be-processed 31.

Figure 4:
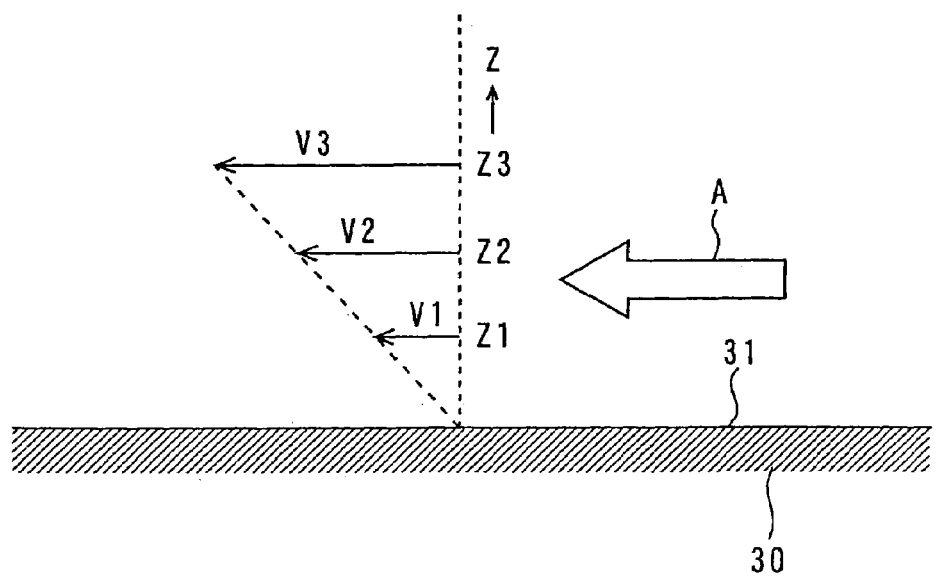
FIG. 4 shows the flow of a chemical over a surface-to-be-processed according to the present invention.

Details of the flow of the chemical 20 effected over the surface-to-be-processed 31 are provided in the descriptive view shown in FIG. 4. As shown in FIG. 4, the horizontal axis represents the surface-to-be-processed 31, and the vertical axis represents a distance Z from the surface-to-be-processed 31. The chemical 20 flows at all times in the direction A shown in FIG. 4; that is, in substantially a given direction along the surface-to-be-processed 31. The chemical 20 located on the surface-to-be-processed 31 assumes a velocity of 0. However, as can be seen from the descriptive view of FIG. 4, as the chemical departs from the surface-to-be-processed 31, the velocity of the chemical 20 becomes greater, in the manner of V1, V2, and V3 (V1<V2<V3). At the largest velocity V3, the speed is saturated and becomes constant. The maximum speed V3 is achieved at a distance Z3 from the surface-to-be-processed 31.

The velocity V is increased in proportion to the distance Z within a range in which the distance Z from the surface-to-be-processed 31 is Z3 or less. A gradient of change in the velocity V; that is, a velocity gradient $\alpha$, is defined as $dV/dZ$. The unit of velocity gradient $\alpha$ is per second (/second).

The present invention is characterized in that chemical processing is performed through use of the chemical 20 while a velocity gradient $\alpha$ of the chemical 20 effected over the surface-to-be-processed 31 is set to a predetermined value; 300/second or more. According to the invention, attention should be paid to the principle that, as the velocity gradient α of the chemical 20 over the surface-to-be-processed 31 becomes larger, an effect for withdrawing the air bubbles 35 remaining in the blind holes 33 by means of flow of the chemical 20 becomes greater. The effect of withdrawing the air bubbles 35 by the flow of the chemical 20 is based on a phenomenon called an entrainment phenomenon. As described in "The Seventh Issue of Mechanical Engineering Handbook," A5, p48, The Japan Society of Mechanical Engineers, the entrainment phenomenon is that a fluid located outside a boundary layer of a flow (i.e., an air bubble trapped in a blind hole) of the flow is absorbed in and flows into the boundary layer.

Figure 5:
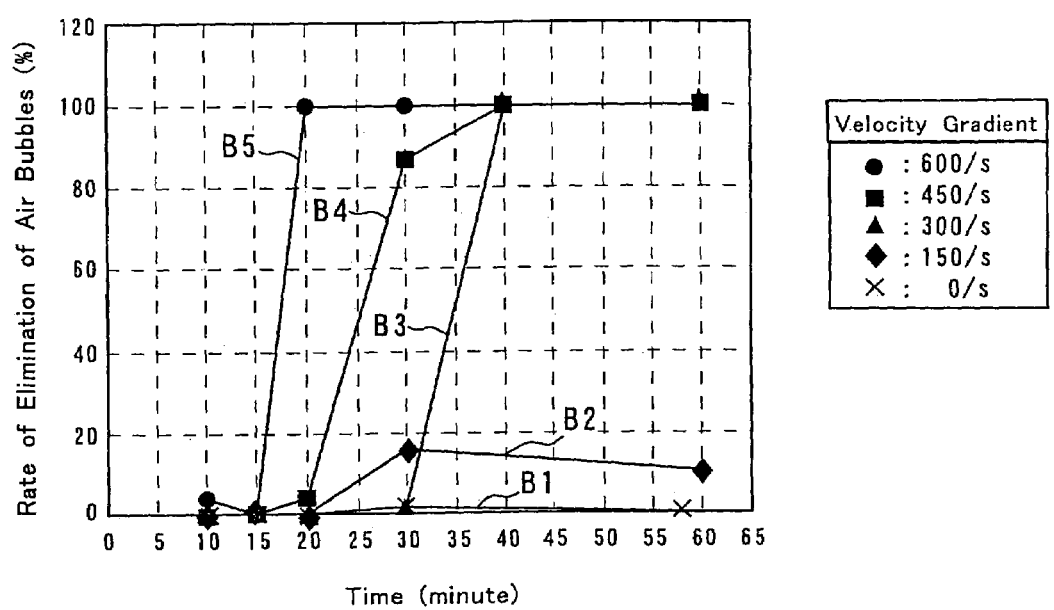
FIG. 5 shows a relationship between a chemical processing time and the rate of elimination of air bubbles.

FIG. 5 shows a result of an experiment showing a relationship between a rate of elimination of air bubbles (hereinafter simply called an "air bubble elimination rate") from the surface-to-be-processed 31 of the semiconductor wafer 30 and a processing time while the velocity gradient α is taken as a parameter. As shown in FIG. 5, the horizontal axis represents a processing time (minutes) which lapses from a point in time when processing is started, and the vertical axis represents a rate of elimination of air bubbles from the blind holes 33 (%). A curve B5 indicated by solid circles represents the result of a test carried out when the velocity gradient α of the chemical 20 over the surface-to-be-processed 31 is set to 600/second. A curve B4 indicated by solid squares shows the result of a test carried out when the velocity gradient α of the chemical 20 is set to 450/second. A curve B3 indicated by solid triangles shows the result of a test carried out when the velocity gradient α is set to 300/second. A curve B2 indicated by solid rhombuses shows the result of a test carried out when the velocity gradient α is set to 150/second. Further, a curve B1 indicated by crosses shows the result of a test carried out when the velocity gradient α is set to 0/second.

As shown in FIG. 5, if the velocity gradient α is set to 600/second, as indicated by the curve B5, an air bubble elimination rate of 100 (%) is obtained after lapse of 20 (minutes) after the start of processing. If the velocity gradient α is 450/second, as indicated by the curve B4, an air bubble elimination rate of 100(%) is obtained after lapse of 40 (minutes) after the start of processing. If the velocity gradient α is 300/second, as indicated by the curve B3, an air bubble elimination rate of 100% is obtained after lapse of 40 (minutes) after the start of processing. If the velocity gradient α is 150/second or 0/second, as indicated by the curves B2, B1, an air bubble elimination rate is 20% or less even after lapse of an hour after the start of processing.

According to the present invention, on the basis of the foregoing tests, the chemical processor 100 is constructed so as to circulate the chemical 20 along the surface-to-be-processed 31 in substantially a given direction at all times and at a velocity gradient α of 300/second or more. According to the chemical processing method of the present invention, the surface-to-be-processed 31 is subjected to chemical processing while the chemical 20 is circulated along the surface-to-be-processed 31 in substantially a given direction at all times and at a velocity gradient α of 300/second or more. Further, according to the semiconductor device manufacturing method of the present invention, the surface-to-be-processed 31 of the semiconductor wafer 30 is subjected to chemical processing in the chemical processing process while the chemical 20 is circulated in substantially a given direction along the surface-to-be-processed 31 at all times and at a velocity gradient α of 300/second or more.

The test results shown in FIG. 5 correspond to test results pertaining to the semiconductor wafer 30 including a plurality of blind holes 33, each hole having an aspect ratio of 2. Each of the blind holes 33 is set to assume an aperture diameter of 50 μm and a depth of 100 μm. From the test results shown in FIG. 5, a processing result analogous to that mentioned previously is considered to be obtained by setting the velocity gradient α of the chemical 20 over the surface-to-be-processed 31 to 300/second or more with regard to the blind hole 33 having an aspect ratio of 2 or less. Since the aspect ratio of blind holes 33 of the semiconductor wafer 30 is generally 2 or less, the present invention provides effective chemical processing of the semiconductor wafer 30.

The first embodiment of the invention will now be described by reference to more specific examples.

First and second examples in which the surface-to-be-processed 31 of the semiconductor wafer 30 is first subjected to cleaning processing will be described. The first and second examples are carried out through use of the chemical processor 100 shown in FIGS. 1 and 2. More specifically, a plurality of via holes 33 are formed in the semiconductor wafer 30 during the process of manufacture of a semiconductor device. After lower open ends of the respective via holes 33 have been closed, to thereby form blind holes 33, the semiconductor wafer 30 is set face up on the wafer holding table 17 in the processing chamber 15 such that the surface-to-be-processed 31 of the semiconductor wafer 30 is oriented upward, and in this state the surface-to-be-processed 31 is subjecting to cleaning processing. The semiconductor wafer 30 is made of gallium arsenide. The via holes 33 are formed by means of, e.g., plasma etching or RIE. Residues associated with etching, such as carbon or chlorine, and resist residues are present in the blind holes 33.

EXAMPLE 1

In the first example, a resist stripper S710 manufactured by Tokyo Ohka Kogyo Co., Ltd. was used as the chemical 20. The chemical 20 contained orthodichlorobenzene, phenol, and alkylbenzene-sulfonate. The chemical 20 was circulated through the processing chamber 15 of the chemical processing cup 10 by means of the pumping device 50. A magnetic pump was used for the pumping device 50, and the chemical 20 was circulated in substantially a given direction over the surface-to-be-processed 31 at all times. Pressure exerted onto the chemical at the outlet 51 of the pumping device 50 was set to 0.12 mega-pascal (MPa), and the chemical 20 was circulated at a flow rate of 13 (liters/minute). In the processing chamber 15, the velocity gradient α of the chemical 20 over the surface-to-be-processed 31 was set to 600/second. In this state, as a result of the surface having been cleaned for thirty minutes, a superior result of cleaning of the surface-to-be-processed 31 including the blind holes 33 was achieved. No failures to remove residues due to build-up of air bubbles were observed.

The temperature of the chemical 20 in the processing chamber 15 was set to 100° C. to 120° C.

EXAMPLE 2

In the second embodiment, a resist stripper EKC265 manufactured by EKC Co., Ltd. of U.S.A. was used as the chemical 20. The chemical 20 contains ethanolamine as the main ingredient. The temperature of the chemical in the processing chamber 15 was set to about 85° C. In other respects, all conditions were made identical with those employed in the first example. Consequently, a result of cleaning of the surface-to-be-processed 31 including the blind holes 33 was satisfactory, and no failures to remove residues due to build-up of air bubbles was observed.

In any of the first and second examples, cleaning failures, such as remaining of residues in the blind holes 33, were not ascertained. The reason for this is considered to be that the air bubbles remaining in the blind holes 33 were withdrawn at the velocity gradient α=600/second of the chemical 20 over the surface-to-be-processed 31.

Next, third and fourth examples in which the surface-to-be-processed 31 of the semiconductor wafer is subjected to electroless plating will be described. Electroless plating was performed after processing pertaining to the cleaning process described in connection with the first or second example had been performed during the course of manufacture of a semiconductor device. The third and fourth examples were carried out while the plurality of via holes 33 were formed in the semiconductor wafer 30 and while lower ends of openings of the via holes 33 were closed so as to form blind holes 33.

Specifically, the electroless plating includes three processes; that is, a palladium activation process, an electroless plating process, and a gold substitution plating process. Both third and fourth examples are the examples of the gold substitution plating process.

The palladium activation process is a process for imparting a palladium catalyst to the surface-to-be-processed 31 that belongs to the semiconductor wafer 30 to be processed and has the blind holes 33. The chemical processor shown in FIGS. 1 and 2 was not used in the palladium activation process. A palladium activation liquid containing palladium chloride ($PdCl_2$) as the main ingredient was placed in a container differing from the chemical processing cup 10. Further, the semiconductor wafer 30 was immersed in the liquid.

The electroless plating process is a process for plating the surface-to-be processed 31 with, e.g., nickel-phosphor (Ni—P) without use of electrolysis. Specifically, a mixture consisting of nickel sulfate ($NiSO_4$) and sodium hypophosphite ($NaH_2PO_4$) was heated to a temperature of 60° C. to 90° C. The semiconductor wafer 30 that had completed undergoing palladium activation processing was immersed in the liquid, to thereby form an Ni—P plating layer to a thickness of 0.2 μm to 0.5 μm. Processing pertaining to the electroless plating process was also performed without use of the chemical processor shown in FIGS. 1 and 2 and through use of a container different from the chemical processing cup 10.

Processing pertaining to third and fourth examples of the final gold substitution plating process were performed through use of the chemical processor 100 shown in FIGS. 1 and 2. The gold substitution plating process is a process for substituting the surface of an Ni—P plating layer with gold. In the third and fourth examples, a magnetic pump was used for the pumping device 50. The chemical 20 was circulated in substantially a given direction along the surface-to-be-processed 31 at a velocity gradient α of 450/second.

EXAMPLE 3

(1) Composition of the chemical 20
Metal supply agent: potassium gold cyanide (several grams/liter)
Stabilizer: chelating agent, complexing agent (tens of grams/liter)
Additive: trace amount
PH: 6 to 7
Temperature of the liquid in the processing chamber 15: 80° C. to 90° C.
(2) Plating time: 45 min to 50 min.
(3) Thickness of a substituted gold plating layer: 0.1 μm
(4) Velocity gradient α of the chemical 20: 450/second on the surface-to-be-processed 31
(5) Plating failures: none

EXAMPLE 4

(1) Composition of the chemical 20
Metal supply agent: gold sulfite (several grams/liter)
Stabilizer: chelating agent, complexing agent (tens of grams/liter)
Additive: trace amount
PH: 7 to 8
Temperature of the liquid in the processing chamber 15: 50° C. to 70° C.
(2) Plating time: 45 min to 50 min.
(3) Thickness of a substituted gold plating layer: 0.1 μm
(4) Velocity gradient α of the chemical 20: 450/second on the surface-to-be-processed 31
(5) Plating failures: none In any of the third and fourth examples, plating failures were not found in the blind holes 33. The reason for this is considered to be that air bubbles are withdrawn from the inside of the blind holes 33 by means of the velocity gradient α of the chemical 20 over the surface-to-be-processed 31.

EXAMPLE 5

In both the third and fourth examples, the blind holes 33 were subjected to electroless plating. The fifth example is directed toward electroplating interior surfaces of the blind holes 33. Processing pertaining to the fifth example of electroplating, for example, in third or fourth example, was performed by forming a layer of gold (Au) on interior surfaces of the blind holes 33 through electroless plating, thus imparting a cathode potential to that layer. An anode electrode is also provided in the processing chamber 15.

For instance, when interior surfaces of the blind holes 33 formed in the semiconductor wafer 30, the wafer being formed from, e.g., gallium arsenide, were plated with gold (Au), a sulfurous-acid-based plating liquid or cyan-based plating liquid was used as the chemical 20. A plating liquid containing gold sodium sulfite or sodium sulfite as a main ingredient is used as the sulfurous-acid-based plating liquid. A plating liquid containing, e.g., gold sodium cyanide, as a main ingredient is used as the cyan-based plating fluid. The temperature of the chemical 20 in the processing chamber 15 was set within the temperature range of 40° C. to 70° C.; e.g., a temperature of 50° C. or 65° C. The interior surfaces were electroplated with gold (Au) in the same manner as that mentioned previously while the chemical 20 was supplied to the processing chamber 15 by means of the pumping device 50 embodied by a magnetic pump and circulated in substantially a given direction along the surface-to-be-processed 31 at all times and at a velocity gradient α of 300/second or more. By means of the velocity gradient α of the chemical 20, air bubbles were withdrawn from the insides of the blind holes 33. Hence, the interior surfaces of the blind holes 33 can be electroplated without involvement of occurrence of a failure which would be caused by an air trap.

The chemical processor according to the first embodiment of the present invention has the chemical processing cup 10 in which the member-to-be-processed 30 is to be placed, and the pumping device 50 which circulates the chemical 20 in the chemical processing cup 10. The surface-to-be-processed 31 is chemically processed face up while the surface-to-be-processed 31 of the member-to-be-processed 30 is oriented upward. The chemical 20 is circulated over the surface-to-be-processed 31 in substantially a given direction at all times at a velocity gradient of 300/second or higher, thereby processing the surface-to-be-processed 31 with a chemical. In relation to the chemical processor which processes the surface-to-be-processed 31 face up, a configuration for processing the surface-to-be-processed 31 while the chemical 20 is circulated in substantially a given direction at all times along the surface-to-be-processed 31 at a velocity gradient of 300/second or higher also yields an effect of withdrawing air bubbles from blind holes in connection with the surface-to-be-processed 31 having the blind holes 33. Occurrence of a processing failure, which would otherwise arise in a surface-to-be-processed having blind holes, for reasons of an air trap, can be prevented.

The chemical processing method of the invention described in connection with the first embodiment is to process the surface-to-be-processed 31 with a chemical while the member-to-be-processed 30 having a plurality of blind holes 33 formed in the surface-to-be-processed 31 is placed in the chemical processing cup 10 such that the surface-to-be-processed 31 is oriented upward. The surface-to-be-processed 31 is processed with a chemical while the chemical 20 is circulated over the surface-to-be-processed 31 in substantially a given direction at all times at a velocity gradient of 300/second or higher. Even under this chemical processing method, the chemical 20 is circulated in substantially a given direction at all times over the surface-to-be-processed 31 at a velocity gradient of 300/second or higher, thereby withdrawing air bubbles from the blind holes 33. As a result, chemical processing can be effected while processing failures due to air bubbles are eliminated.

Under the chemical processing method, the member-to-be-processed 30 is the semiconductor wafer 30 having the plurality of blind holes 33, and the insides of the blind holes 33 are cleansed with the chemical 20. By means of this method, residues remaining in the blind holes 33 can be cleansed without involvement of occurrence of cleaning failures which would otherwise be caused by air bubbles.

Under this chemical processing method, the member-to-be-processed 30 is the semiconductor wafer 30 having a plurality of blind holes 33. The blind holes 33 are plated with the chemical 20. By means of this method, the blind holes 33 can be plated without involvement of occurrence of plating failures which would otherwise be caused by air bubbles in the blind holes 33.

The semiconductor device manufacturing method of the invention described in connection with the first embodiment includes a chemical processing process for the semiconductor wafer 30 having the plurality of blind holes 33 formed in the surface-to-be-processed 31. In the chemical processing process, the semiconductor wafer 30 is placed in the chemical processing cup 10 such that the surface-to-be-processed 31 is oriented upward. The chemical 20 is circulated along the surface-to-be-processed 31 in substantially a given direction at all times and at a velocity gradient of 300/second or more, whereby the surface-to-be-processed 31 is chemically processed. Even during the chemical processing process in the semiconductor device manufacturing method, the chemical 20 is circulated along the surface-to-be-processed 31 in substantially a given direction at all times and at a velocity speed of 300/second or more, whereby air bubbles are withdrawn from the blind holes 33. Thus, processing failures due to air bubbles are prevented, so that the surface-to-be-processed can be chemically processed.

Under the semiconductor device manufacturing method, the insides of the blind holes 33 are cleansed in a chemical processing process. Residues remaining in the blind holes 33 can be cleansed without involvement of occurrence of cleaning failures caused by air bubbles.

Under the semiconductor device manufacturing method, the blind holes 33 are plated through the chemical processing process. The blind holes can be plated without involvement of occurrence of plating failures caused by air bubbles remaining in the blind holes 33.

Second Embodiment

Figure 6:
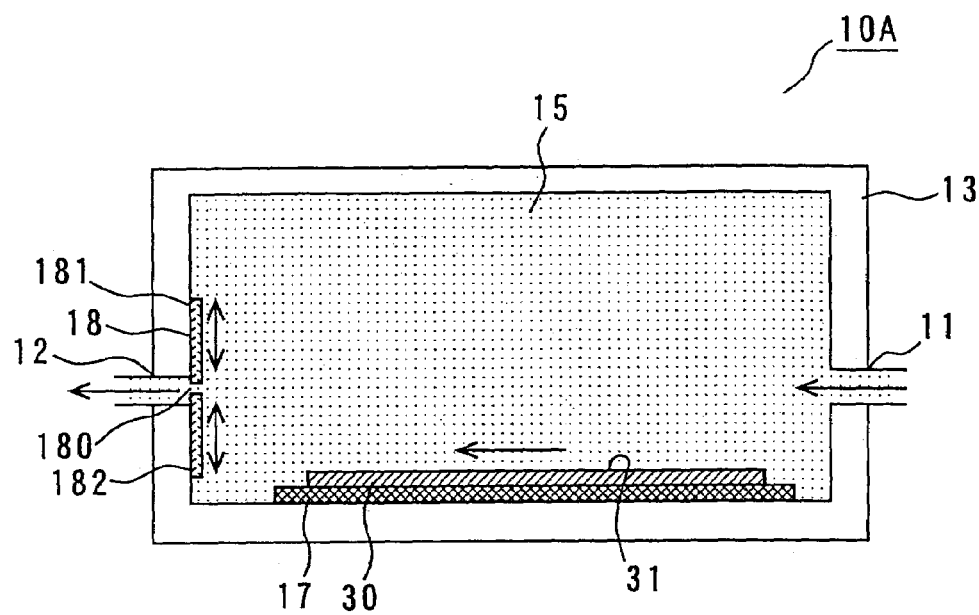
FIG. 6 is a cross-sectional view of a chemical processing cup according to a second embodiment.

FIG. 6 shows a chemical processing cup 10A according to a second embodiment of the chemical processor of the present invention. A regulation member 18 capable of regulating an effective aperture area of the drain port 12 is provided on an interior surface of the chemical drain port 12 of the container 13. In other respects, the chemical processor is identical in configuration with the chemical processor 100 shown in FIGS. 1 and 2.

The regulation member 18 has a pair of regulation plates 181, 182 which are provided along a sidewall surface of the container 13 and capable of moving vertically. An effective aperture 180 is formed between the regulation plate 181 and the regulation plate 182. The regulation plate 181 can be moved vertically within an area located above the center of the drain port 12, and the regulation plate 182 can be moved vertically within an area located below the center of the drain port 12. The effective aperture area of the drain port 12 can be changed by means of changing an overlapping area located between the regulation plate 181 and the drain port 12 and that located between the regulation port 182 and the drain port 12. By means of the effective aperture area of the drain port 12 being changed by the regulation member 18, the liquid current status of the chemical 20 in the processing chamber 15 provided in the chemical processing cup 10 is changed. The velocity gradient α of the chemical 20 on the surface-to-be-processed 31 can be readily regulated while the chemical 20 is maintained in substantially the same direction over the surface-to-be-processed 31 of the semiconductor wafer 30. Further, variations in the velocity gradient α can also be diminished. By means of regulating operation of the regulation member 18, the velocity gradient α on the surface-to-be-processed 31 is held at a predetermined value of 300/second or more, thereby increasing an effect of suppressing occurrence of cleaning failures or plating failures, which would otherwise be caused by the air bubbles 35.

Third Embodiment

Figure 7:
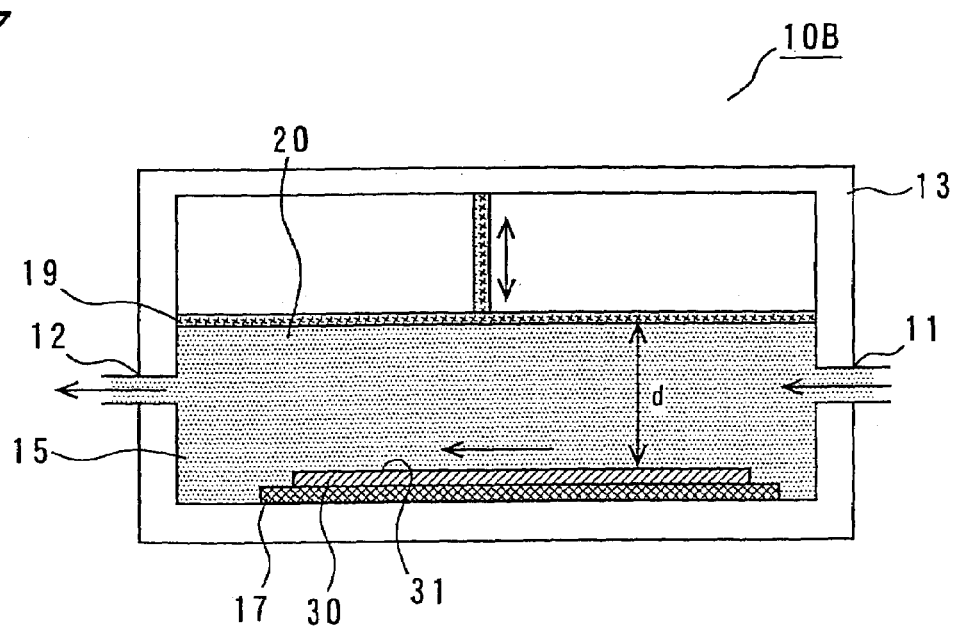
FIG. 7 is a cross-sectional view of a chemical processing cup according to a third embodiment.

FIG. 7 shows a chemical processing cup 10B according to a third embodiment of the chemical processor of the present invention. The chemical processing cup 10B of the third embodiment is embodied by additionally placing a flow rate regulation plate 19 in the processing chamber 15 of the container 13. In other respects, the chemical processor is identical in configuration with the chemical processor 100 shown in FIGS. 1 and 2.

The flow rate regulation plate 19 is provided in parallel with the surface-to-be-processed 31 and fitted along respective internal sidewall surfaces of the processing chamber 15, thereby limiting the flow of the chemical 20 in a lower portion of the flow rate regulation plate 19. The flow rate regulation plate 19 can be moved vertically within the processing chamber 15 while remaining in parallel with and spaced a distance "d" away from the surface-to-be-processed 31. By means of the flow rate regulation plate 19, the flow of the chemical 20 over the surface-to-be-processed 31 is held in substantially the same direction. In addition, the velocity gradient α of the chemical 20 over the surface-to-be-processed 31 is regulated by vertical movement of the regulation plate 19, thereby diminishing variations in the velocity gradient α. By means of causing the flow rate regulation plate 19 to approach the surface-to-be-processed 31, the velocity gradient α over the surface-to-be-processed 31 can be increased. By means of regulation operation of the flow rate regulation plate 19, the velocity gradient α over the surface-to-be-processed 31 is held at a predetermined value of 300/second or more. An effect of preventing cleaning failures or plating failures, which would otherwise be caused by the air bubbles 35, can be enhanced.

The features and advantages of the present invention may be summarized as follows.

According to one aspect, the chemical processor of the present invention, even when the surface-to-be-processed of the member-to-be-processed includes blind holes, can chemically process the surface-to-be-processed while air traps in the blind holes are eliminated.

According to another aspect, the surface-to-be-processed can be chemically processed while the air traps in the blind holes formed in the surface-to-be-processed are eliminated.

According to other aspect, the surface-to-be-processed of the semiconductor wafer can be chemically processed while the air traps in the blind holes formed in the surface are eliminated, thereby enabling an improvement in the reliability of a finished semiconductor device and a yield.

Obviously many modification and variation of the present invention are possible in the light of the above teachings. It is therefore to be understood that within the scope of the appended claims the invention may by practiced otherwise than as specifically described.

The entire disclosure of a Japanese Patent Application No.2002-337539, filed on Nov. 21, 2002 including specification, claims, drawings and summary, on which the Convention priority of the present application is based, are incorporated herein by reference in its entirety.

What is claimed is:

1. A chemical processing method comprising:
   placing a member-to-be-processed having a plurality of blind holes in a surface-to-be-processed in a chemical processing cup with said surface-to-be-processed oriented upward; and
   chemically processing said surface-to-be-processed by circulating a liquid chemical along said surface-to-be-processed in substantially a single direction at all times and at a velocity gradient of at least 300/second.

2. The chemical processing method according to claim 1, wherein said member-to-be-processed is a semiconductor wafer, and including cleaning the insides of said blind holes with said liquid chemical.

3. The chemical processing method according to claim 1, wherein said member-to-be-processed is a semiconductor wafer, and including plating said blind holes with using said liquid chemical.

4. The chemical processing method according to claim 1, wherein aspect ratio of said blind holes is no more than 2.

5. A method for manufacturing a semiconductor device comprising:
   placing a semiconductor wafer having a plurality of blind holes in a surface-to-be-processed in a chemical processing cup with said surface-to-be-processed is oriented upward;
   chemically processing said surface-to-be-processed by circulating a liquid chemical along said surface-to-be-processed in substantially a single direction at all times and at a velocity gradient of at least 300/second.

6. The method for manufacturing a semiconductor device according to claim 5, including cleaning the insides of said blind holes while said semiconductor wafer is chemically processed.

7. The method for manufacturing a semiconductor device according to claim 5, including plating said blind holes while said semiconductor wafer is chemically processed.

8. The method of manufacturing a semiconductor device according to claim 5, wherein aspect ratio of said blind holes is no more than 2.

* * * * *